(12) United States Patent
Doering et al.

(10) Patent No.: US 8,148,702 B2
(45) Date of Patent: Apr. 3, 2012

(54) ARRANGEMENT FOR THE ILLUMINATION OF A SUBSTRATE WITH A PLURALITY OF INDIVIDUALLY SHAPED PARTICLE BEAMS FOR HIGH-RESOLUTION LITHOGRAPHY OF STRUCTURE PATTERNS

(75) Inventors: Hans-Joachim Doering, Jena (DE); Thomas Elster, Jena (DE); Joachim Heinitz, Jena (DE); Matthias Slodowski, Jena (DE)

(73) Assignee: Vistec Electron Beam GmbH, Jena (DE)

( * ) Notice: Subject to any disclaimer, the term of this patent is extended or adjusted under 35 U.S.C. 154(b) by 330 days.

(21) Appl. No.: 12/635,140

(22) Filed: Dec. 10, 2009

(65) Prior Publication Data
US 2010/0148087 A1 Jun. 17, 2010

(30) Foreign Application Priority Data
Dec. 13, 2008 (DE) .......................... 10 2008 062 450

(51) Int. Cl.
*G03F 7/00* (2006.01)
*G21K 5/04* (2006.01)
*H01J 29/00* (2006.01)
*H01J 37/147* (2006.01)

(52) U.S. Cl. ............... 250/492.22; 250/310; 250/396 R; 250/397; 250/398; 250/492.1; 250/492.2; 250/492.3; 250/493.1

(58) Field of Classification Search .................. 250/310, 250/396 R, 397, 398, 492.1, 492.2, 492.22, 250/492.3, 493.1
See application file for complete search history.

(56) References Cited

U.S. PATENT DOCUMENTS

| | | | | |
|---|---|---|---|---|
| 5,905,267 A | * | 5/1999 | Muraki | 250/492.22 |
| 5,929,454 A | * | 7/1999 | Muraki et al. | 250/491.1 |
| 5,981,954 A | * | 11/1999 | Muraki | 250/397 |
| 5,981,962 A | * | 11/1999 | Groves et al. | 250/492.23 |
| 6,014,200 A | * | 1/2000 | Sogard et al. | 355/53 |
| 6,166,387 A | * | 12/2000 | Muraki et al. | 250/492.2 |
| 6,175,122 B1 | | 1/2001 | Groves et al. | |
| 6,274,877 B1 | * | 8/2001 | Muraki | 250/492.23 |
| 6,515,409 B2 | * | 2/2003 | Muraki et al. | 313/359.1 |

(Continued)

FOREIGN PATENT DOCUMENTS
GB 2349737 A 11/2000

OTHER PUBLICATIONS

Klein, C. et al., "Projection Mask-Less Lithography (PML2): Proof-of-Concept Setup and first experimental Results," Emerging Lithographic Technologies XII, Proc. of SPIE vol. 6921, 69211O, (2008).

(Continued)

*Primary Examiner* — David A Vanore
(74) *Attorney, Agent, or Firm* — Houston Eliseeva, LLP

(57) ABSTRACT

The invention is directed to an arrangement for the illumination of a substrate with a plurality of individually shaped, controllable particle beams, particularly for electron beam lithography in the semiconductor industry. It is the object of the invention to find a novel possibility for illuminating a substrate with a plurality of individually shaped, controllable particle beamlets which permits a high-resolution structuring of substrates with a high substrate throughput without limiting the flexibility of the applicable structure patterns or limiting the high substrate throughput due to a required flexibility.

22 Claims, 9 Drawing Sheets

U.S. PATENT DOCUMENTS

| | | | |
|---|---|---|---|
| 6,603,128 B2* | 8/2003 | Maehara et al. | 250/441.11 |
| 6,614,035 B2* | 9/2003 | Hartley | 250/492.23 |
| 6,680,481 B2* | 1/2004 | Okino | 250/491.1 |
| 6,703,629 B2* | 3/2004 | Nakasugi | 250/492.22 |
| 6,784,442 B2* | 8/2004 | Muraki et al. | 250/492.2 |
| 7,005,658 B2 | 2/2006 | Muraki | |
| 7,049,585 B2* | 5/2006 | Nakasuji et al. | 250/310 |
| 7,157,703 B2* | 1/2007 | Nakasuji et al. | 250/311 |
| 7,253,417 B2* | 8/2007 | Frosien et al. | 250/396 R |
| 7,504,624 B2* | 3/2009 | Kawasaki et al. | 250/310 |
| 7,781,748 B2* | 8/2010 | Platzgummer | 250/492.22 |
| 7,825,377 B2* | 11/2010 | Kawasaki et al. | 250/306 |
| 2003/0141462 A1 | 7/2003 | Hartley | |
| 2007/0114409 A1* | 5/2007 | Kawasaki et al. | 250/310 |
| 2008/0149846 A1* | 6/2008 | Platzgummer | 250/398 |
| 2009/0014649 A1* | 1/2009 | Nakasuji et al. | 250/310 |
| 2009/0184243 A1* | 7/2009 | Kawasaki et al. | 250/310 |
| 2009/0200495 A1* | 8/2009 | Platzgummer | 250/492.22 |
| 2010/0178602 A1* | 7/2010 | Seto et al. | 430/30 |
| 2011/0084220 A1* | 4/2011 | Koning et al. | 250/492.3 |
| 2011/0114838 A1* | 5/2011 | Han et al. | 250/307 |
| 2011/0163229 A1* | 7/2011 | Frosien et al. | 250/310 |
| 2011/0226968 A1* | 9/2011 | Platzgummer | 250/492.3 |

OTHER PUBLICATIONS

Slot, E. et al., "MAPPER: High Throughput Maskless Lithography," Emerging Lithographic Technologies XII, Proc. of SPIE vol. 6921, 69211P, (2008).

* cited by examiner

ARRANGEMENT FOR THE ILLUMINATION OF A SUBSTRATE WITH A PLURALITY OF INDIVIDUALLY SHAPED PARTICLE BEAMS FOR HIGH-RESOLUTION LITHOGRAPHY OF STRUCTURE PATTERNS

RELATED APPLICATIONS

This application claims priority to German Patent Application No. DE 10 2008 062 450.0, filed Dec. 13, 2008, which is incorporated herein by reference in its entirety.

FIELD OF THE INVENTION

The invention is directed to an arrangement for the illumination of a substrate with a plurality of individually shaped, controllable particle beams with a particle beam source for emitting a particle beam, an illumination system for shaping and deflecting the particle beam for the illumination of a first aperture diaphragm array, wherein the aperture diaphragm array is a multiple-format diaphragm array for generating separate particle beamlets, a second multiple-format diaphragm array on which the first multiple-format diaphragm array is imaged by means of a condenser lens system and which has diaphragm apertures that are adapted to the first multiple-diaphragm array while taking into account the imaging scale, a multibeam deflector system for individual beam deflection of the separate particle beams, and reduction optics having at least one stage for reduced imaging of the particle beamlets passed by the second aperture diaphragm array onto a substrate. The invention is preferably applied in electron beam lithography, particularly in the semiconductor industry, for direct structuring of wafers and masks for photolithography.

BACKGROUND OF THE INVENTION

With each technology node, that is, about every three years, there is a doubling of the quantity of structures on a component surface of the same size. Therefore, the image-generating methods for producing structures on masks and methods for direct structuring of wafers require increasingly longer writing times. Another reason for reduced productivity in high-resolution electron beam writers in high-end mask fabrication is the increasing degree of pre-distortion of the mask structure (optical proximity correction—OPC) to improve the structure resolution of high-productivity scanner objectives whose resolution, as is well-known, is diffraction-limited.

The demand in the semiconductor industry for lowering costs by reducing writing times in high-end mask fabrication and in direct exposure of wafers cannot be met by currently available single-beam writing technologies.

For this reason, alternative multibeam concepts are being adopted to an increasing extent. Multi-shape beam lithography concepts promise an appreciable increase in throughput especially for very high integration levels (<65 nm technology). The concept is based on the idea of simultaneously providing a plurality of particle beams whose shape and size can be adjusted and whose position on the substrate can be controlled. Two main methods for increasing throughput in particle beam lithography systems are known from the prior art.

On one side are the solutions for multibeam systems which work closely in parallel and use large arrays ($10^4$-$10^7$ beams) of finely focused particle beam bundles of fixed shape and size (electron beam pixels) which are guided substantially collectively over the substrate to be exposed (stage movement and deflection systems) and which are timed to be switched on and off corresponding to the pattern to be exposed. This pixel concept is represented, e.g., by MAPPER (see C. Klein et al., "Projection maskless lithography (PML2): proof-of-concept setup and first experimental results", Proceedings SPIE Advanced Lithography 2008, vol. 6921-93), and PML2 (see E. Slot et al., "MAPPER: high throughput maskless lithography", Proceedings SPIE Advanced Lithography 2008, vol. 6921-92). The disadvantages of these concepts are the high complexity of the beam modulators (thousands to hundreds of thousands of deflection systems/lenses) and the high data transfer rates owing to the fact that the circuit layout must be broken down into individual pixels without losses so that any hierarchy or compression is lost.

The second group of solutions is based on variably shaped beams (also known as shaped probes) which are used to expose desired structures in a variable manner by projecting beam cross sections of different area on a substrate (VSB—variable shaped beam).

U.S. Pat. No. 6,703,629 B2 discloses a fairly complex character projection (CP) method in which different masks are imaged one above the other in two planes, and possibly deflected by a deflection system located therebetween, in such a way that typical recurring beam patterns are formed and are then reduced and used for exposure. The drawbacks of this method consist in the fixed choice of character aperture geometry once it has been produced. Another level of technology requiring different conductive path distances or CP dimensions requires a new pair of character apertures. Another disadvantage of this exposure method consists in that, for reasons inherent to the principle, the current density within a character is constant. Accordingly, a correction of the proximity effect depending on the exposure environment, particularly for a large character, is difficult to accomplish, which limits the usefulness and quality of the generated patterns.

It is known from U.S. Pat. No. 7,005,658 B2 to generate an array of particle beams by means of an aperture plate which is illuminated in parallel in that a shared radiation source is collimated by means of a condenser lens. All of the partial beams are corrected individually by correction lenses and deflection systems in such a way that the field distortion and field curvature occurring in the reduction system disappear. The array of spot beams generated in this way is then guided collectively over the substrate to be exposed, and the partial beams are switched on and off (blanking array) at the proper times corresponding to the desired pattern.

A disadvantage in this method is the large amount of pixel data required for exposing a given pattern. Further, a large number of complicated electrostatic correction elements such as lens arrays and deflection arrays are required for controlling the positions and focus planes of all of the partial beams in the target. Another disadvantage in this method is that the individual beams in the target plane have the same size and are located on a fixed position grid. In order to meet current requirements for positioning accuracy of patterns to be exposed (placement 2-5 nm), multiple exposures must be carried out with a slight positional offset (so-called grayscale exposure or gray beaming) which, as is well known, results in a deterioration of structure edges and reduces productivity.

U.S. Pat. No. 5,981,962 A and U.S. Pat. No. 6,175,122 B1 describe an electron beam lithography system as a distributed arrangement of multiple variable shaped beams working in parallel. The concept, which is conceived as a compact miniature system, uses two pinhole diaphragms per electron-optical system which are imaged on one another and a deflection system arranged therebetween for controlling the beam cross section. An external, uniform magnetic field provides for the focused imaging of the diaphragm planes on one another and on the target. It is suggested that the position deflection in the target is carried out by moving the substrate stage in one direction and by collective, line-by-line electrostatic deflection in orthogonal direction. Every miniaturized VSB system (variable shaped beam system) is supplied by separate electron sources (emitter arrays).

A disadvantage in this method is the 1:1 imaging of the beam-shaping diaphragms in the target plane. The required edge roughness of lithographic structures is presently in the range of a few nanometers for advanced technologies. Accordingly, the quality of the diaphragms to be used would have to be even better, which appears very difficult in terms of technology, particularly with respect to the generation of such small corner radii. Contamination effects at the diaphragm edges in practical operation are likewise effective in a ratio of 1:1 during exposure and therefore limit the quality of the patterns and the life of the diaphragms. Further, the resources required for providing an entire array of radiation sources and for monitoring them individually is disadvantageous. A very high mechanical accuracy and high uniformity of the magnetic field is required in order to maintain the focusing condition simultaneously for all beam bundles, which can only be achieved at great expense.

Further, it remains unclear how collective focusing is to be carried out when the target (e.g., machined wafer) has inevitable residual unevenness. Finally, the collective deflection of all of the beams in the target plane presents a severe limitation on the quantity of beams that can be used simultaneously for exposure or defines a fixed grid for pattern generation. The fixed grid of the beam bundles must constantly be aligned with the necessary reference positions of the patterns to be exposed. In the case of very precise draft grids of the patterns, this substantially limits productivity and/or flexibility of the exposure device.

U.S. Pat. No. 6,614,035 B2 describes a multibeam system whose operation is very similar to that of the known VSB system (single beam). In order to separate a plurality of individually controllable beams in the area of the two beam-shaping diaphragm planes, it is suggested that a diaphragm is arranged at that location which subdivides the conventional illuminated area (diaphragm aperture) by inserting struts into a plurality of openings. Every beam bundle formed in this manner receives four individual deflection systems which are arranged in two portions of the electron-optical column and carry out two independent functions. The upper, first deflection system stage serves to individually adjust the beam cross section and the second defecting system stage serves to adjust the distance between adjacent beam bundles within certain limits. The subsequent reduction and positioning of the array of beam bundles in the lower imaging portion is carried out collectively and in exactly the same way as in a VSB system.

This concept has the disadvantage that the deflection of the beam bundles in two orthogonal directions is carried out in only one plane because, in deflection arrangements with such close proximity of the beams, simultaneous deflection in two orthogonal directions leads to large deflection errors which impair the edge quality and uniformity of the illumination. This also applies to deflection systems for individual control of the mutual beam distance in an array of partial beams that are to be controlled individually. Further, there are no concrete proposals for preventing crosstalk between the adjacent deflection systems which are arranged within a very confined space in proximity to the beam for every beam of the multibeam system.

Another weakness in the concept is the use of a plurality of small variable beam cross sections of comparable size for the exposure process of an entire design layout. Typically, the layout to be exposed does not contain exclusively very small structures even at an advanced level of integration, but rather also larger structures. The gain in productivity which is achieved when exposing many small structures by means of an array of 4 to 16 beams working in parallel can be partially negated when the layout contains a series of relatively large patterns with unfavorable spacing.

SUMMARY OF THE INVENTION

It is the object of the invention to find a novel possibility for illuminating a substrate with a plurality of individually shaped, controllable particle beams which permits a high-resolution structuring of substrates with a high substrate throughput without limiting the flexibility of the structure patterns to be illuminated or sacrificing a high substrate throughput for a high flexibility of structure patterns to be illuminated.

In an arrangement for the illumination of a substrate with a plurality of individually shaped, controllable particle beams with a particle beam source for emitting a particle beam, an illumination system for shaping and deflecting the particle beam for the illumination of a first aperture diaphragm array, wherein the aperture diaphragm array is a multiple-diaphragm array for generating separate particle beamlets, a second multiple-diaphragm array on which the first multiple-diaphragm array is imaged by means of a condenser lens system and which has diaphragm apertures which are adapted to the first multiple-diaphragm array while taking into account the imaging scale, a multibeam deflector system for individual beam deflection of the separate particle beams, and reduction optics having at least one stage for reduced imaging of the particle beamlets passed by the second aperture diaphragm array onto a substrate, the above-stated object is met according to the invention in that the first multiple-diaphragm array and the second multiple-diaphragm array are constructed as multiple-format diaphragm arrays for generating particle beamlets with different beam cross sections, in that at least three multibeam deflector arrays for individual deflection of the particle beamlets are associated with the first multiple-format diaphragm array and with the second multiple-format diaphragm array, wherein at least a first multibeam deflector array is arranged between the first multiple-format diaphragm array and the second multiple-format diaphragm array in order to generate different cross sections of the particle beamlets after the second multiple-format diaphragm array by means of an individual beam deflection of the individual particle beamlets, at least a second multibeam deflector array is arranged in the vicinity of the second multiple-format diaphragm array in order to individually deflect partial crossovers of the individual particle beamlets or to deliberately blank individual particle beamlets at an exit aperture diaphragm arranged in a crossover downstream, and at least a third multibeam deflector array is arranged downstream of the second multiple-format diaphragm array at a distance of 10-20% of the distance between the multiple-format diaphragm array and the crossover in order to generate different positions of the particle beamlets on the substrate.

The multibeam deflector arrays are advantageously composed of two deflector chips which are arranged one on top of the other and on each of which is provided a deflector cell array comprising identical pairs of electrodes for the individual deflection of individual particle beamlets in the same direction lateral to the optical axis, wherein the pairs of electrodes of the deflector cell arrays on the two deflector chips are oriented in substantially orthogonal directions relative to one another.

In a preferred embodiment form, an illumination group selector with a stigmator arranged downstream is arranged in the beam path of the illumination system for the particle beam emitted by the particle beam source for selecting an illumination group on the first multiple-format diaphragm array.

The multiple-format diaphragm arrays advantageously have at least two large diaphragm apertures with an edge length in the range of 30 µm to 200 µm for exposure with large-format particle beamlet and at least one beam-shaping diaphragm group comprising a plurality of small diaphragm apertures with an edge length in the range of 5 µm to 20 µm for exposure with an array of small-format particle beamlets.

The multiple-format diaphragm arrays can advisably have different beam-shaping diaphragm groups, wherein one of a plurality of different beam-shaping diaphragm groups of the first multiple-format diaphragm array can be illuminated separately by means of the illumination group selector of the illumination system in order to generate differently dimensioned particle beamlets and arrays of particle beamlets.

In a first variant, the multibeam deflector arrays for individual deflection of the particle beamlets are preferably arranged in such a way that the first multibeam deflector array is arranged behind the first multiple-format diaphragm array, the second multibeam deflector array is arranged in front of the second multiple-format diaphragm array, and the third multibeam deflector array is arranged behind the second multiple-format diaphragm array.

In a second variant, the first multibeam deflector array can be arranged in front of the second multiple-format diaphragm array, and the second multibeam deflector array and third multibeam deflector array are arranged behind the second multiple-format diaphragm array.

In a third embodiment form, the first multibeam deflector array is arranged behind and in the immediate vicinity of the first multiple-format diaphragm array, the second multibeam deflector array is arranged in front of and in the immediate vicinity of the second multiple-format diaphragm array, and the third multibeam deflector array is arranged behind the second multiple-format diaphragm array at a distance equal to 10% to 20% of the distance to the next crossover.

In a fourth variant, the first multibeam deflector array can be arranged in front of and in the immediate vicinity of the second multiple-format diaphragm array, the second multibeam deflector array can be arranged behind and in the immediate vicinity of the second multiple-format diaphragm array, and the third multibeam deflector array can be arranged behind the second multiple-format diaphragm array at a distance equal to 10% to 20% of the distance to the next crossover.

In a fifth advantageous variant, the first multibeam deflector array is arranged behind and in the immediate vicinity of the first multiple-format diaphragm array, the second multibeam deflector array is arranged behind and in the immediate vicinity of the second multiple-format diaphragm array, and the third multibeam deflector array is arranged behind the second multiple-format diaphragm array at a distance equal to 10% to 20% of the distance to the next crossover.

In a sixth variant, the first multibeam deflector array is arranged behind and in the immediate vicinity of the first multiple-format diaphragm array, the second multibeam deflector array is arranged in front of and in the immediate vicinity of the second multiple-format diaphragm array, the third multibeam deflector array, as a first precision positioning array, is arranged behind and in the immediate vicinity of the second multiple-format diaphragm array, and a fourth multibeam deflector array, as second precision positioning array, is arranged behind the third multibeam deflector array.

In all of the variants mentioned above, a stigmator having at least two stages is advisably arranged between the third multibeam deflector array and the reduction system imaging on the substrate in order to correct for tolerance-dependent distortion.

It has proven advantageous to arrange the pairs of electrodes of the deflector cell array of every multibeam deflector array orthogonal to one another on the deflector chips located one on top of the other.

Further, when a beam-shaping diaphragm group is used in an array with a format (n×m), the multibeam deflector arrays advisably have a deflector cell array with at least (n+2) rows and (m+2) columns of deflector cells of parallel electrode pairs on every deflector chip, and no voltage is applied to the outside deflector cells.

To compensate for crosstalk between adjacent deflector cells of the deflector cell array, means for calculating voltage and regulating voltage are advantageously provided in which exclusively the crosstalk effect of the respective eight directly adjacent deflector cells is taken into account for each particle beamlet considered individually in order to calculate the correction of the deflection voltages within a deflector cell array.

In this connection, the multibeam deflector arrays preferably have fast pipeline structures comprising multi-channel active components for fast independent control of the beam position, cross-sectional area, and individual crossover position for each particle beamlet, wherein the pipeline structures advisably contain multi-DA converters, demultiplexers, and multi-operational amplifiers.

It has proven advisable to provide a coupling matrix for controlling all of the multibeam deflector arrays in order to achieve an independent control of the position and size of the particle beamlet on the substrate and of the individual crossover position for each particle beamlet of an array of particle beamlets in the X-direction and Y-direction.

To increase the flexibility of the exposable structure patterns, at least the second multiple-format diaphragm array has, in addition, special characters (structure patterns) for exposing repetitive structures.

Further, it is advisable when the multiple-format diaphragm arrays have a plurality of different beam-shaping diaphragm groups with identical diaphragm apertures or a plurality of beam-shaping diaphragm groups with different diaphragm apertures.

To minimize the quantity of individual exposure steps on the substrate, a pre-programmable control unit is advisably provided for controlling the illumination group selector with stigmators arranged downstream in order to optimize the selection of illumination groups on the first multiple-format diaphragm array.

The basic idea behind the invention is the known concept of variable shaped beams (VSB concept) which, as a single beam concept, makes it possible to combine a relatively large maximum area of the beam cross section with an array of variably controllable shaped beams with small beamlet areas. In the course of exposing a substrate, fast deflecting processes can be used to switch between these beam modulation variants electron-optically. Further, steps which succeed in minimizing the crosstalk between the electrostatic deflection systems which are provided separately for each particle beamlet are described for the deflection of the variable, finely-structured shaped beams.

The inventive solution makes it possible to realize an illumination of a substrate with particle radiation which permits a high-resolution structuring of substrates with a high substrate throughput without limiting the flexibility of the structure patterns to be illuminated or sacrificing substrate throughput for a flexibility of the structure patterns that can be illuminated.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
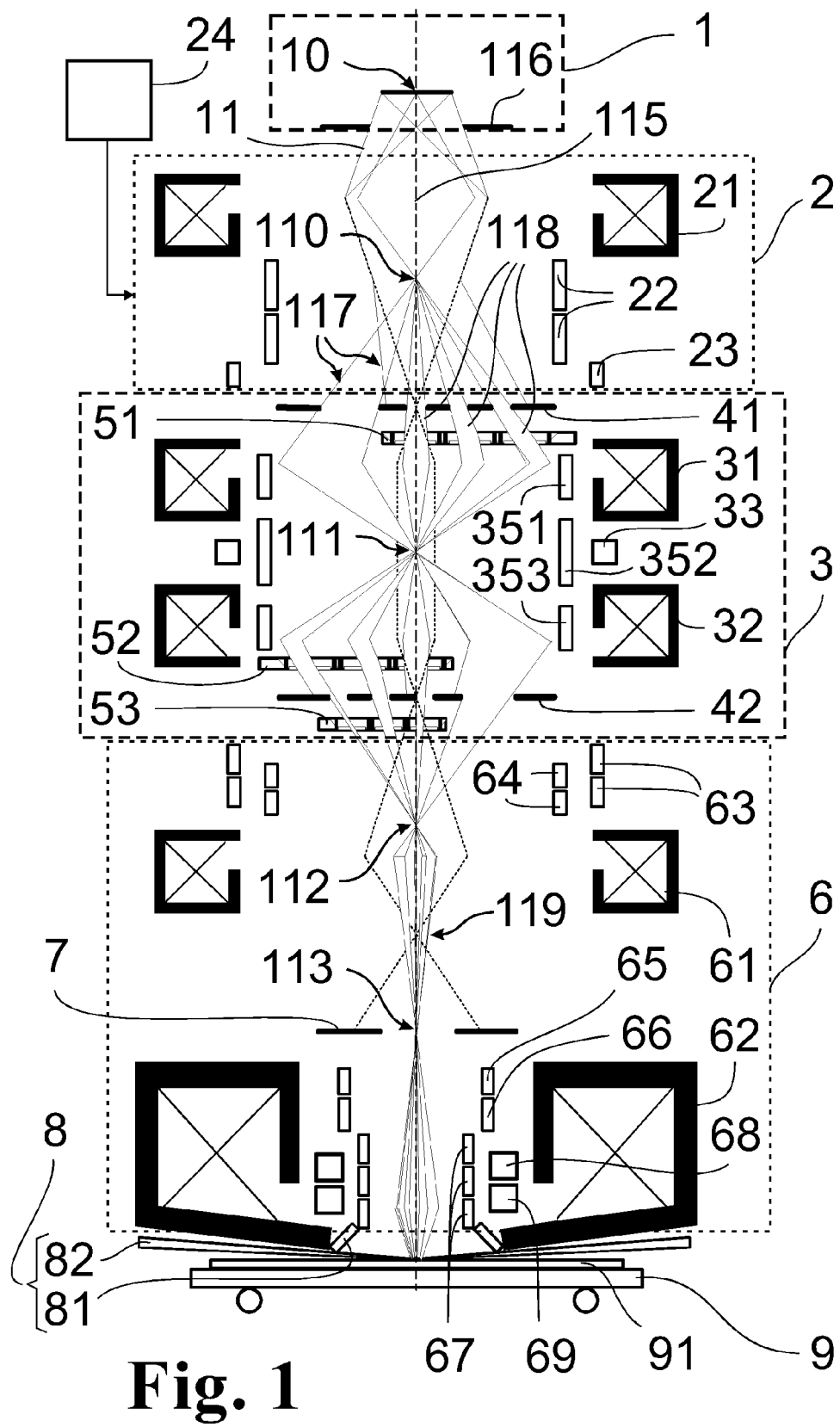
FIG. 1 shows a schematic diagram of the arrangement according to the invention, showing selected particle beamlets.

As is shown schematically in FIG. 1, the arrangement for substrate illumination with a plurality of individual particle beams basically comprises a particle beam source 1 defining an optical axis 115 along which the entire particle beam column up to the substrate 91 has the following components: an illumination system 2 for illuminating a first multiple-format diaphragm array 41 in selectable illumination groups, a beam modulator system 3 for generating a plurality of particle beamlets 118 containing, in addition to a condenser system 31-32, a group deflection system 35 and a multideflector system 5 cooperating with a multi-aperture diaphragm system 4 for individual deflection and shaping of the individual particle beamlets 118. Following the latter is a reduction system 6 for imaging the particle beamlets 118 transmitted by the multi-aperture diaphragm system 4 onto the substrate 91 moving on a substrate stage 9. A substrate monitoring sensor arrangement 8 is provided directly above the substrate stage 9 for observing the structure patterns which are exposed on the substrate 91 by means of the particle beamlets 118.

The generation of an array of variably controllable particle beamlets 118 within the beam modulator system 3 is characterized in that a first multiple-format diaphragm array 41 and a second multiple-format diaphragm array 42 are arranged in two diaphragm planes and are outfitted in each instance with equivalent beam-shaping diaphragm groups 45 comprising arrays of small openings (5 to 20 µm) associated with one another and, optionally, additional larger openings (30 to 200 µm). The first multiple-format diaphragm array 41 is imaged on the second multiple-format diaphragm array 42 by a condenser system 31-32 (preferably in a scale of 1:1).

On their path through the condenser system 31-32 to the second multiple-format diaphragm array 42, the particle beamlets 118 pass through at least one group deflection system 35 and at least one multibeam deflector array 51 and 52 of the multideflector system 5 in addition to the condenser system 31-32.

When the first multiple-format diaphragm array 41 is illuminated by an illumination group 117 installed in the illumination system 2 in the region of a beam-shaping diaphragm group 45 (see FIG. 7a), an array of particle beamlets 118 is generated and passes through the condenser system 31-32 and the collective group deflection system 35 on its path toward the second multiple-format diaphragm array 42. An individual displacement (deflection) of every particle beamlet 118 lateral to the beam direction by means of deflection can be carried out by individually controllable electric fields in two coordinate directions within each of the multibeam deflector arrays 51 and 52.

The multibeam deflector arrays 51 and 52 are advisably arranged in the vicinity of one of the multiple-format diaphragm arrays 41 and/or 42. Following this at a distance of 10% to 20% of the distance to the next crossover 112 is the third multibeam deflector array 35 which serves as a precision positioning system for the individual positioning of the individual particle beamlets 118 on the substrate 9. In this connection, it is necessary that at least one multibeam deflector array 51 is situated between the two multiple-format diaphragm arrays 41 and 42. This multibeam deflector array 51 can be arranged optionally in the vicinity of either the first multiple-format diaphragm array 41 or the second multiple-format diaphragm array 42.

The positioning of a multibeam deflector array 51 and 52, respectively, shown in FIG. 1, in the vicinity of the multiple-format diaphragm arrays 41 and 42 can accordingly also be modified in such a way that both of the multibeam deflector arrays 51 and 52 are arranged in the vicinity of the second multiple-format diaphragm array 42, i.e., one in front of it and the other behind it.

In every case, a cropping of each particle beamlet 118 accordingly takes place at the location of the second multiple-format diaphragm array 41 depending on its actual individual displacement through the at least one multibeam deflector array 51 located between the multiple-format diaphragm arrays 41 and 42.

The use of the specially structured multibeam deflector arrays 51 and 52, whose specific construction is shown in FIGS. 3a, 4a, 4b and 5, makes possible an additional individual position control of every particle beamlet 118 in the crossover 111 inside the array of the particle beamlets 118, namely, regardless of their individual format size (beam cross section). The at least one multibeam deflector array 51 downstream of the second multiple-format diaphragm array 42 is responsible for this. A precision correction of the beam positions in the crossover 112 is carried out by another identically constructed multibeam deflector array 53 arranged downstream.

Figure 7A:
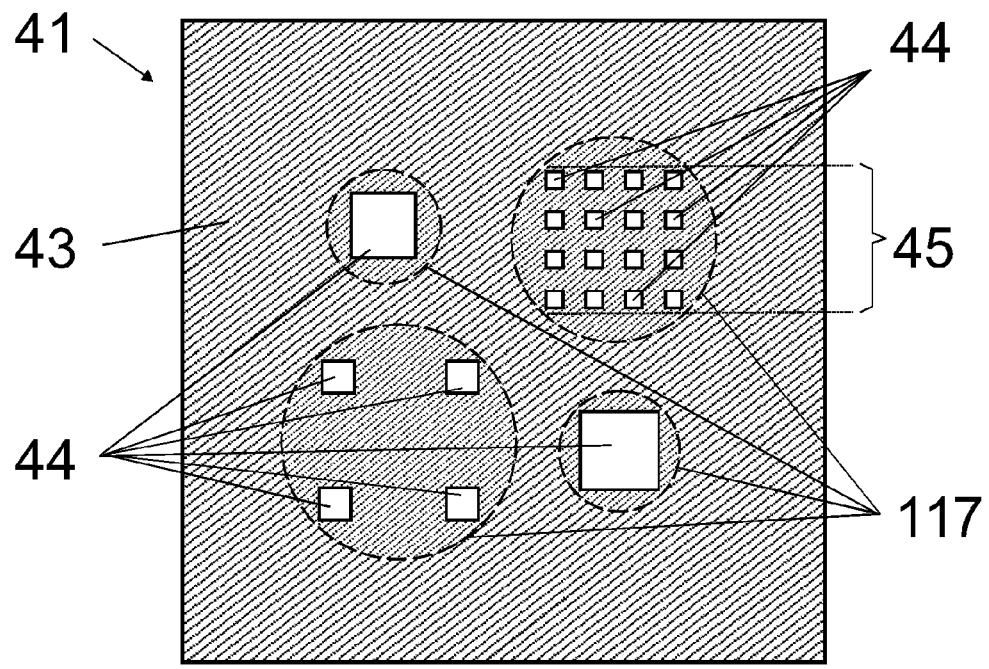
FIG. 7 shows basic embodiment forms of the first multiple-format diaphragm array (FIG. 7a) and second multiple-format diaphragm array (FIG. 7b)

The multi-stage group deflection system 35 in the area of the condenser system 31-32 serves to control particle beamlets 118 formed as a result of the selection of an illumination group 117 in the region of larger diaphragm apertures 44 (30 to 200 μm edge dimension) of the multiple-format diaphragm array 41 (see FIG. 7a). By outfitting the diaphragm plates 43 of the multiple-format diaphragm arrays 41 and 42 with large-format diaphragm apertures 44 (30 to 200 μm) in addition to the small-format (5 to 20 μm) diaphragm apertures 44, larger illumination surfaces can also be realized on the substrate 91 with the same exposure arrangement in order to expose large-area patterns on the substrate 91 in a time-saving manner.

FIG. 1 shows a first embodiment form of the invention in which the illumination is carried out—for the sake of simplicity—by means of an individual particle beam source 1 which comprises an adapting condenser 21, an illumination group selector 22 having a beam deflection system for deflecting the particle beam 11 from the optical axis 115, and a stigmator 23. The function of the condenser 21 of the illumination system 2 is to image the beam output diaphragm 116 of the particle beam source 1 on a first multiple-format diaphragm array 41 and to generate a first intermediate image of the beam output 10 of the particle beam source 1 in the crossover 110.

Depending on a structure pattern to be generated on the substrate 91, an illumination group 117 for selective illumination of a diaphragm aperture 44 which is shaped in a definite manner or a beam-shaping diaphragm group 45 of the first multiple-format diaphragm array 41 is automatically selected and controlled in the illumination system 2 of the particle beam column which is characterized by a linear optical axis 115 from the beam outlet of the particle beam source 1 to the target on the substrate 91 to be exposed. This selection of the beam-shaping diaphragms is carried out by means of a suitable deflection of the particle beam 11 by means of the illumination group selector 22.

When using a first multiple-format diaphragm array 41 according to FIG. 7a, individual large variably shaped particle beams can be selected through large diaphragm apertures 44 and an array of smaller variable particle beamlets 118 can be selected through the beam-shaping diaphragm group 45. Further, when using a second multiple-format diaphragm array 42 according to FIG. 7b in which the diaphragm plate 43 does not have the same diaphragm apertures 44 as the first multiple-format diaphragm array 41, other beam shape variants such as, e.g., rhombuses, triangles, etc. (principle of generation according to DD 241 500 A1) or special characters 46 (FIG. 7b) can also be generated as is described more fully referring to FIG. 7b.

Other variants for beam shaping of an individual particle beam cross section having a relatively large variable area by means of imaging two diaphragms on top of one another with a beam deflection system arranged therebetween are carried out in the manner already known from the prior art (e.g., U.S. Pat. No. 6,175,122 B1, U.S. Pat. No. 6,614,035 B2). Also, the generation and projection of special characters 46 (see FIG. 7b) or the imaging of parts thereof which are provided (selected) through one of the larger openings 44 in the first multiple-format diaphragm array 41 and a character 46 in the second multiple-format diaphragm array 42 are known.

The stigmator 23 is provided for correcting possible astigmatism in the crossover 111 of the illumination system 2.

The principal innovation of the invention consists in the additional possibility of the beam cross section control of an array (group) of particle beamlets 118 by means of multibeam deflector arrays 51, 52 in the vicinity of at least one of the multiple-format diaphragm arrays 41 and 42 so that variably shaped particle beamlets 118 of small beam cross-sectional area (5 to 20 μm) can be generated in an individually controllable manner simultaneously or successively within the same particle beam column without a mechanical changing of diaphragms.

The completely independent control of the size of the individual beam cross section in two coordinate directions lateral to the beam direction and the additional individual position deflection of every particle beamlet 118 on the substrate 91 make possible a substantially faster simultaneous exposure of a plurality of different structures of a chip design to be exposed on the substrate 91.

However, since a chip design to be exposed on the substrate 91 usually also contains some large structures or frequently recurring characters 46, it is often advantageous to be able to select the most productive beam-shaping diaphragm group 45 (see FIGS. 7a, 7b) for the exposure of such structure regions without having to exchange one or both multiple-format diaphragm arrays 41 and 42. This diaphragm selection initially takes place within the illumination system 2 by means of the illumination group selector 22.

When the first multiple-format diaphragm array 41 is illuminated by an illumination group 117 installed in the illumination system 2 in the region of a beam-shaping diaphragm group 45 (see FIG. 7a), an array of particle beams 118 is generated which passes at least one multibeam deflector array 51, three collective group deflection systems 351, 352, and 353, and a correction lens 33 in addition to the two condenser lenses 31 and 32 on its path through the condenser system 31-32 to the second multiple-format diaphragm array 42.

The at least one multibeam deflector array 51, 52 makes possible an individual displacement of every individual particle beamlet 118 generated through the first multiple-format diaphragm array 41 in two coordinate directions as will be explained in more detail in the following with reference to FIGS. 3a and 3b and FIGS. 4a and 4b.

Figure 7B:
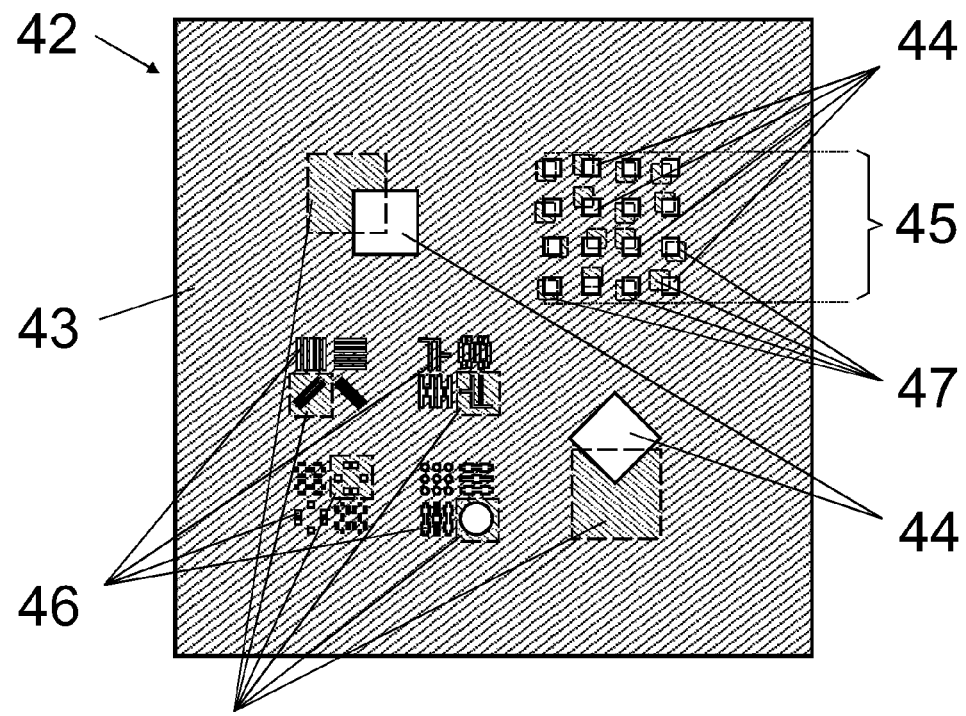

A cropping of each particle beamlet 118 depending on its individual lateral displacement is carried out at the location of the second multiple-format diaphragm array 42 as is indicated in FIG. 7b by the heavier hatching of the partial beam cross section 47 in that the individual particle beamlets 118 are reduced to the average area of the partial beam cross section and respective diaphragm aperture of the multiple-format diaphragm array 42.

The use of specially structured multibeam deflector arrays 51, 52 and possibly additional multibeam deflector arrays 53 or 54, whose specific constructions are shown in FIGS. 3b, 4a, 4b and 5, make possible an additional individual position control of crossovers 111 and 112 for each particle beamlet 118 within the array of (small-format) particle beamlets 118 regardless of their individual format size. Accordingly, after the particle beam 11 is split into particle beamlets 118, a usually narrowly limited crossover 111, 112 or 114 can be distributed into partial crossovers which no longer coincide spatially. Further, notwithstanding this advantageously intended spatial distribution of individual partial crossovers, the term crossover 111, 112 or 113 will continue to be used in the following to associate the position of the individual crossovers of an orthogonal plane to the optical axis 115.

A multi-stage group deflection system 35 in the area of the twofold condenser system 31-32 serves to control the particle beamlets 118 when an illumination group 117 in the area of larger diaphragm apertures 44 (30 to 200 µm) of the multiple-format diaphragm array 41 is selected.

When a three-stage group deflection system 35 is used, as is designated more exactly in FIGS. 1, 2, 8 and 9 by group deflection systems 351 to 353, the middle deflection system 352 preferably makes it possible to control the beam cross section (format size control) or the selection of special diaphragm structures 46 (FIG. 7b) in the second multiple-format diaphragm array 42, and deflection systems 351 and 353 are provided for blanking individual particle beamlets 118 so that these particle beamlets 118 either already impinge directly on the second multiple-format diaphragm array 42 or impinge on the aperture diaphragm 7 positioned in the crossover 113 farther along the beam path.

Since the multiple-format diaphragm arrays 41 and 42 are subjected to constant bombardment by the particle beam 11 and particle beamlets 118, it can be advantageous to arrange a plurality of multiple-format diaphragm arrays 41, 42 in such a way that they are displaceable lateral to the optical axis when required (e.g., because of wear or other design requirements) as coupled, i.e., etched on a chip, multiple-format diaphragm arrays (41', 41", ... and 42', 42", ... , respectively) and are therefore exchangeable without having to readjust the particle beam column. A variant of this kind is shown by way of example in FIG. 9 by exchangeable, identical multiple-format diaphragm arrays 41' and 42'.

Further, a correction lens 33 can be provided in the beam modulator system 3 between the condenser lenses 31 and 32. This correction lens 33 makes possible a highly accurate angular orientation of the image of the first multiple-format diaphragm array 41 at the location of the second multiple-format diaphragm array 42 to compensate for mechanical adjustment tolerances.

The portion of the illumination control and multi-shape beam control described above is followed farther along the beam path of the particle beam column in direction of the substrate stage 9 by a reduction system 6 which carries out a reduced imaging of the second multiple-format diaphragm array 42 on the substrate 91 located on the substrate stage 9 by means of electromagnetic lenses 61 and 62. Apart from the two-stage reduction optics 61-62 shown in the drawing, optics with only one or with three lenses can also be used.

The reduction system 6 is outfitted with diverse deflection systems for controlling the particle beam positions on the substrate 91 such as beam return system 63, beam tracking 65, micro beam deflection 66 and macro beam deflection 67 as well as stigmators 64 and 69 and a fast focusing lens 68. The imaging scale for the reduced imaging of the second multiple-format diaphragm array 42 on the substrate 91 is typically 30:1-100:1.

A third multibeam deflector array 53 (as precision positioning system for the position of every particle beamlet 118 on the substrate 91) is located at a distance of about 10-20% of the distance between the second multiple-format diaphragm array 42 and the next crossover 112. This precision positioning system 53 is identical in principle to the multibeam deflector arrays 51 and 52, but has a different scaling factor. It permits a small individual position displacement of every particle beamlet 118 (5 to 20 µm) lateral to the beam direction.

Figure 6:
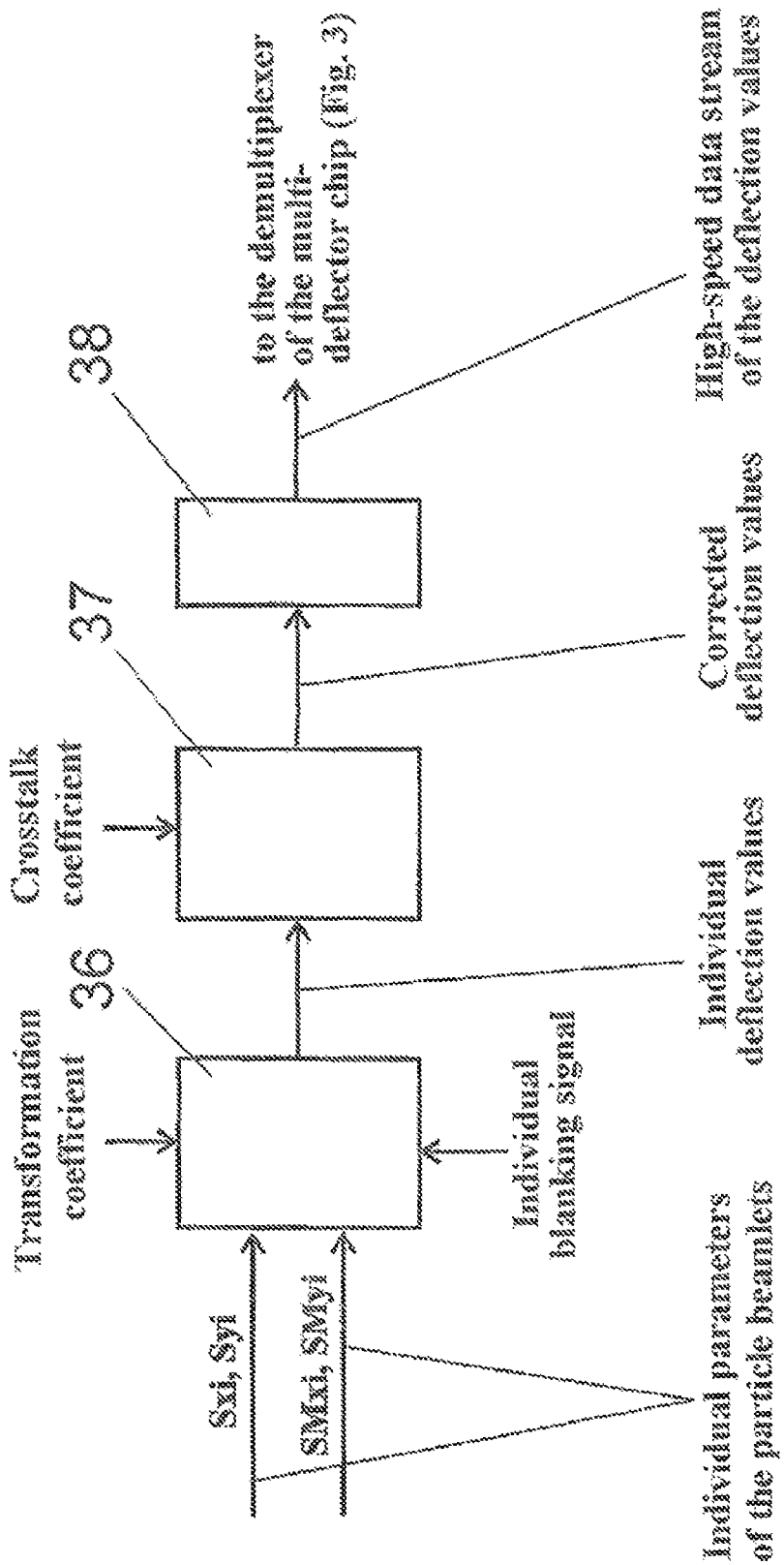
FIG. 6 shows a flow chart showing the data provided for controlling a multibeam deflector array according to FIGS. 3a and 3b.

The electronic control of the two respective deflector cell arrays 57 within each of the multibeam deflector arrays 51, 52 and 53 is carried out by an individual calibrated coupling matrix which is generated and suitably further processed, according to FIG. 6, in order to impress on all of the particle beamlets 118 in the array an individual format size ($S_{xi}$, $S_{yi}$), an individual precision positioning ($SM_{xi}$, $SM_{yi}$) and an individual position of the crossover 112. For this purpose, the actual parameters derived from the chip design to be exposed, the format size ($S_{xi}$, $S_{yi}$) and ($SM_{xi}$, $SM_{yi}$) and precision positioning, are converted in a digital coupling matrix computing unit 37 with suitable transformation coefficients and blanking signals for individual particle beamlets 118 into individual deflection values for every deflector (electrode pair 573) of the total of six deflector cell arrays 57. Because of the closely adjacent structure of the deflector cell arrays 57, the individual deflection values from the coupling matrix computing unit 37 are then converted into corrected deflection values in a crosstalk correction computing unit 38 with crosstalk coefficients which take into account the special structure of the deflector cell arrays 58 and are fed to a data multiplexer 39. The data multiplexer 39 generates a high-speed data stream of deflection values to the individual demultiplexers 59 of the six individual deflector chips 55 (see FIG. 3). The entire procedure for calculating the individual corrected deflection values is carried out in the computing units 37 and 38 in real time for all of the multideflector arrays 51, 52 and 53 (pipeline structure).

A two-stage beam return system 63 and a two-stage stigmator 64 are arranged in the beam path in front of the first reduction stage (lens 61). The beam return system 63 ensures that the particle beamlets 118 are deflected again to the optical axis 115 by the respective beam-shaping diaphragm group 45 being used, which should advisably be located outside the optical axis 115, without influencing the position of the crossover 112 along the optical axis 115. This serves to reduce aberrations. Also, the stigmator 64 can help to reduce distortion.

The reduced intermediate image 119 of the portions of the partial beam cross sections 47 which pass through the diaphragm apertures 44 and which were defined by the illumination area 117 through the first multiple-format diaphragm array 41 (FIG. 7a) and were changed individually by the group deflection systems 35 and the individual deflection systems of the multibeam deflector arrays 51 and 52 and the change in shape and size by the second multiple-format diaphragm array 42 are imaged once again in reduced manner on the substrate 91 by the second reduction stage (lens 62).

In so doing, the aperture diaphragm 7 defines the substrate aperture and serves as a blanking diaphragm for temporarily unused particle beamlets 118. The beam position of the reduced image of the beam-shaping diaphragm group 45 being used can be positioned on the substrate 91 in the conventional manner by microbeam deflection 66 and macrobeam deflection 67.

Further, according to the construction shown in FIG. 1, a deflection system 65 for beam tracking during the exposure of the substrate 91 on the continuously moving substrate stage 9 can be advantageous. A fast focusing lens 68 in cooperation with another stigmator 69 serves for continuous, exact focusing of the particle beamlets 118 on the substrate 91 based on the values measured by a height sensor 81. Typical unevenness of the substrate 91 and a possible deflection defocusing can be corrected in this way. The backscattering particle detector 82 serves to detect marks and for beam calibration.

Figure 2:
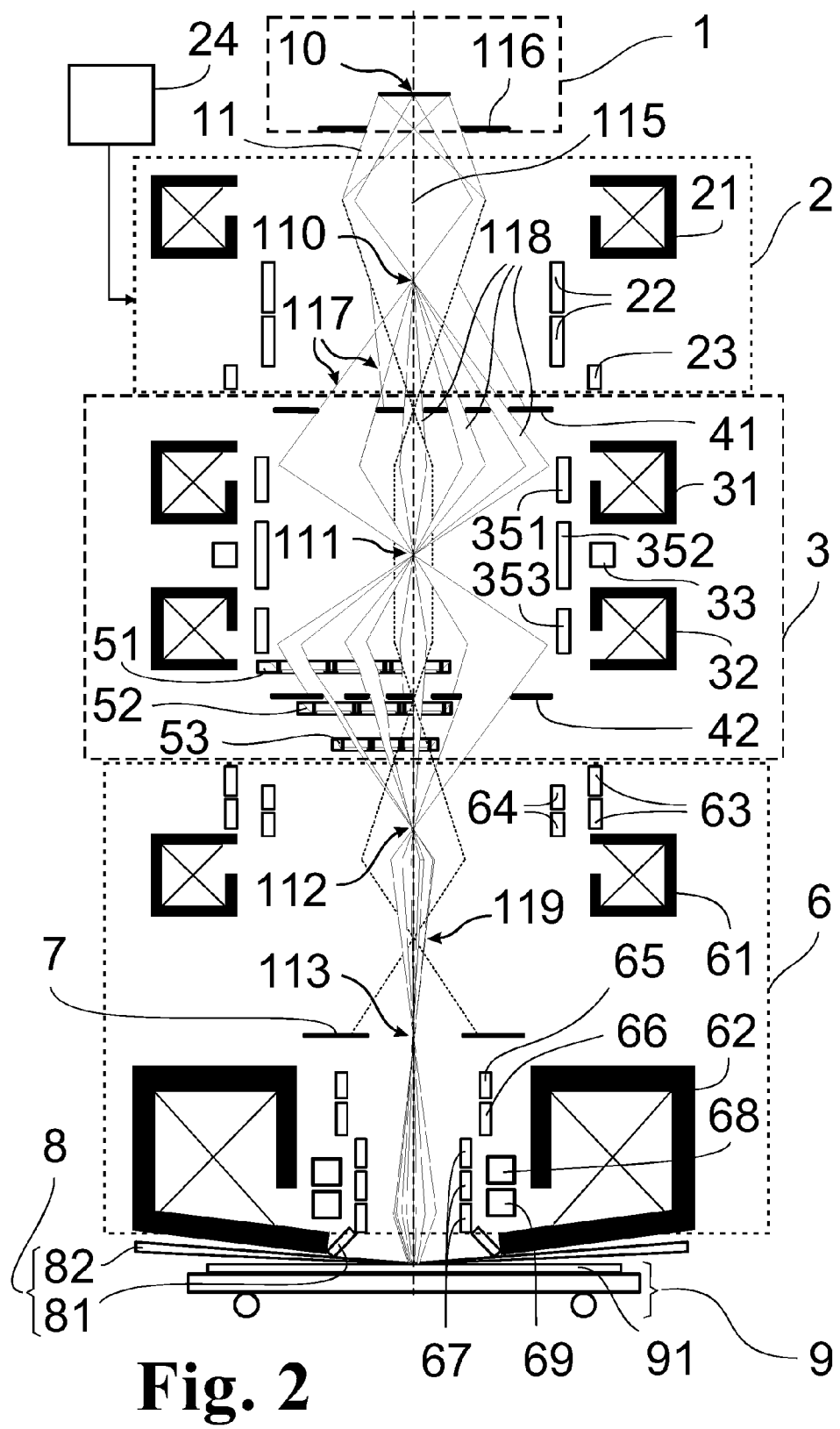
FIG. 2 shows an embodiment form of the invention with an arrangement of the multibeam deflector arrays for the particle beamlets, all in the vicinity of the second multiple-format diaphragm array.

With the construction of the particle beam column according to FIG. 1 remaining the same in other respects, FIG. 2 shows another configuration of the multibeam deflector system 5. In this example, all of the multibeam deflector arrays 51 are positioned in the vicinity of the multiple-format diaphragm array 42. In so doing, the multibeam deflector array 51 arranged in front of the second multiple-format diaphragm array 42 provides for the beam deflection of the particle beamlets 118 to achieve an individually differing cropping of its cross sections through the multiple-format diaphragm array 42. The multibeam deflector array 52 causes the inclinations of the individual particle beamlets 118 to be reset by amounts opposite to those by which they were deflected by means of the first multibeam deflector array 51 (for purposes of the format cropping by the second multiple-format diaphragm array 42). The precision deflection of the individual particle beamlets 118 for their position on the substrate 91 is carried out by the third multibeam deflector array 53 in the form of a precision positioning array.

Figure 8:
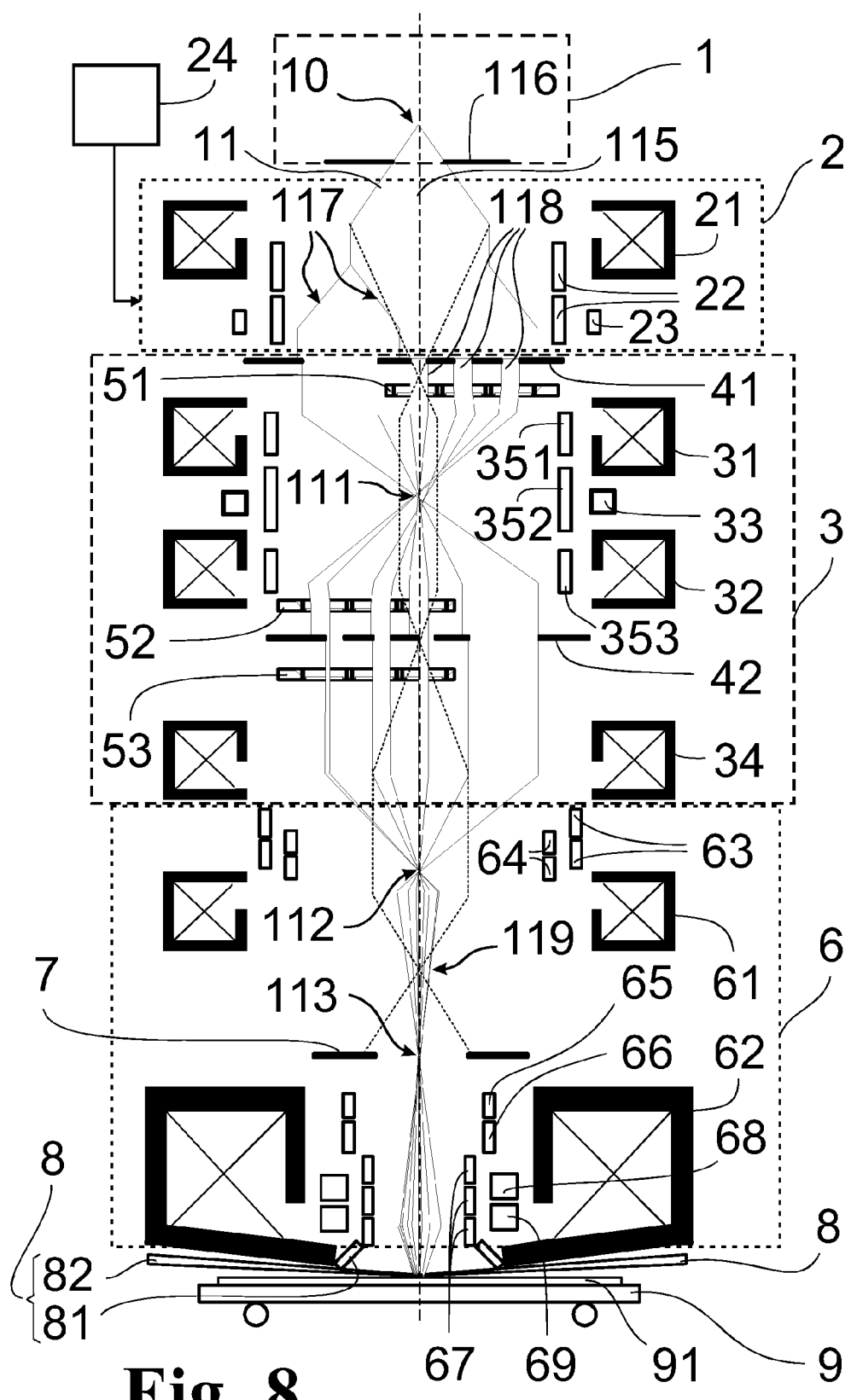
FIG. 8 shows another embodiment form of an electron beam lithography device with parallel orientation of the particle beam in front of the first multiple-format diaphragm array and a multibeam deflector array following the first and second multibeam deflector arrays in front of and behind the second multiple-format diaphragm array.

FIG. 8 shows the pupil beam path of another variant of a particle-optical imaging system for a multiform beam lithography system. As in the variant according to FIG. 1 or FIG. 2, the illumination of the particle beam source 1 is determined through the beam outlet 110 and the outlet aperture diaphragm 116.

In this constructional variant, however, the condenser lens 21 of the illumination system 2 provides for a telecentric illumination of the first multiple-format diaphragm array 41. The illumination group selector 22 serves for beam alignment and specific selection (i.e., spatially defined illumination) of a determined beam-shaping diaphragm group 45 on the multiple-format diaphragm array 41 (FIG. 7a). The stigmator 23 is provided for correcting astigmatism that may possibly occur in the crossover 111.

As in the first variant, the condenser lens system 31-32 provides for a 1:1 imaging of the first multiple-format diaphragm array 41 on the second multiple-format diaphragm array 42. The multibeam deflector arrays 51 and 52 make it possible to individually displace each of the particle beamlets 118 generated by the second multiple-format diaphragm array 41 within the array in two coordinate directions. A cropping of every particle beamlet 118 according to its individual displacement is carried out at the location of the second multiple-format diaphragm array 42. As in the first variant, three other deflection systems 351, 352, 353 in the area of the condenser lens system 31-32 serve to control beam-shaping diaphragm groups 45 with large beam cross sections. Also, lens 33 is again used for highly accurate angular orientation of the image of the first multiple-format diaphragm array 41 at the location of the second multiple-format diaphragm array 42.

In contrast to the first constructional variant according to FIG. 1, three-stage reduction optics (60, 61, 62) are used in FIG. 8. The lens 60 generates an intermediate image of the crossover 111 and provides for a continued telecentric beam path with respect to the second multiple-format diaphragm array 42. The reduction system 6 further comprises lenses 61 and 62, as was described with reference to the variants according to FIGS. 1 and 2, and provides for the corresponding reduced imaging (30:1 to 100:1) of the second multiple-format diaphragm array 42 on the substrate 91. Both variants according to FIG. 1 and FIG. 8 use the same conventional positioning, measuring and correction systems.

The main advantage of the variant according to FIG. 8 over the constructions in FIGS. 1 and 2 is that the third multibeam deflector array 53 for individual precision positioning of the beamlets 118 on the substrate 91 can be constructed identical to the two multibeam deflector arrays 51 and 52. This facilitates alignment processes.

A principal advantage of the imaging variant shown in FIG. 8 consists in the prevention of an intermediate image of the beam outlet 10 of the particle source 1 in front of the first multiple-format diaphragm array 41, which occurs as a crossover 110 in the first variant (according to FIG. 1).

Since the total flow of particles is always higher in the illumination system 2 than in the following imaging stages, significant interactions take place in the crossover 110 of the particle beamlets 118. Such interactions can contribute to a disruptive energy expansion in the beam which causes additional chromatic errors in the subsequent lenses and accordingly ultimately impairs resolution. Therefore, the arrangement of the particle columns described above with reference to FIG. 8 is more advantageous in this respect than the variants according to FIGS. 1 and 2.

Figure 9:
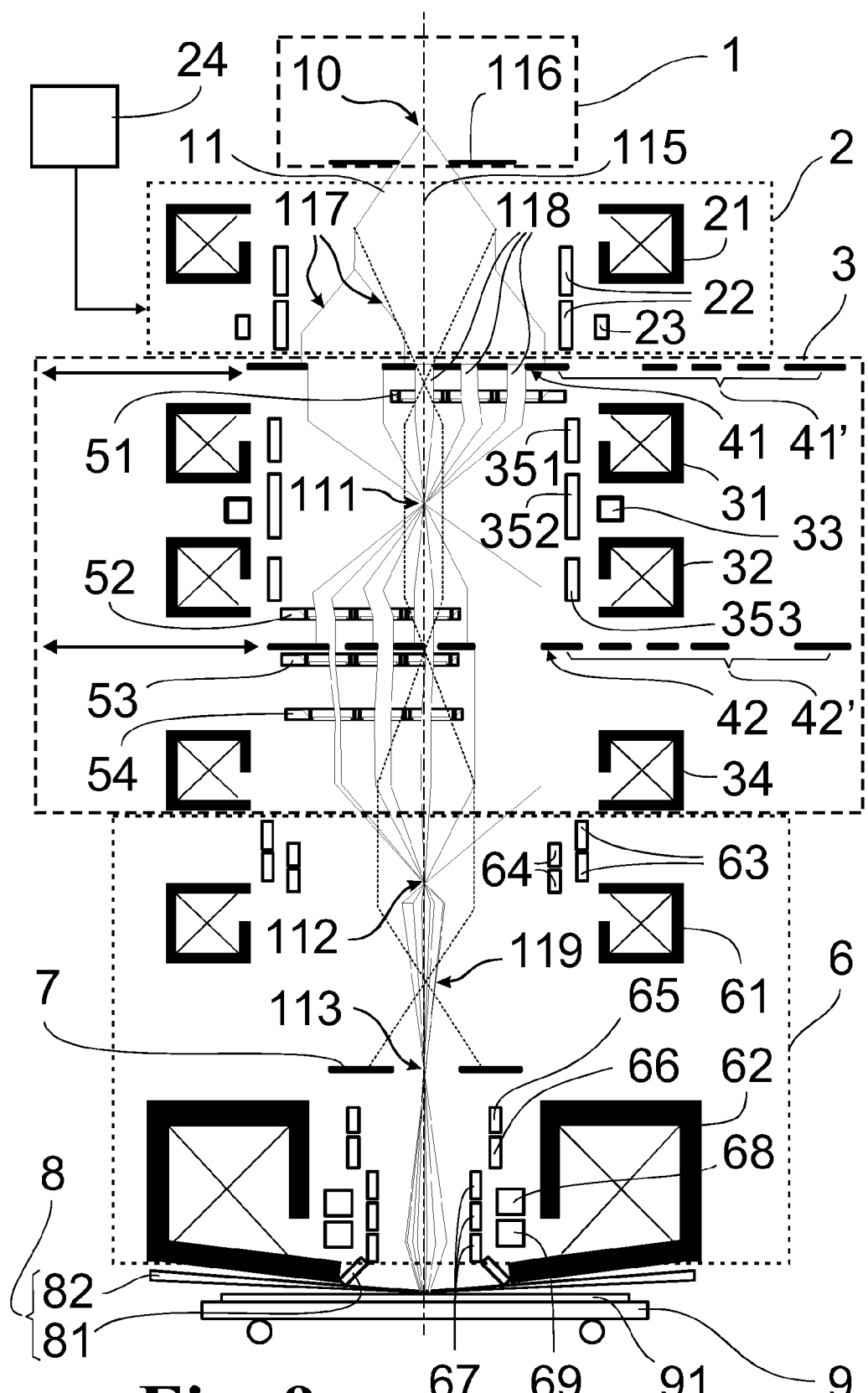
FIG. 9 shows an embodiment form of an electron beam lithography device with telecentric illumination as in FIG. 8 and four multibeam deflector arrays, wherein one multibeam deflector array is arranged after the first multiple-format diaphragm array, one multibeam deflector array is arranged in front of the second multiple-format diaphragm array, and two multibeam deflector arrays are arranged after the second multiple-format diaphragm array.

FIG. 9 shows a modified variant of the particle beam column with telecentric illumination according to FIG. 8. Instead of the three multibeam deflector arrays 51 to 53 which were originally provided in the beam modulator system 3, four such multibeam deflector arrays 51-54 are provided. While the first multibeam deflector array 51 organizes the individual position control of the particle beamlets 118 in the crossover 111 to generate the least possible interaction between the individual particle beamlets 118, the second multibeam deflector array 52 is provided for separate orientation of the individual particle beamlets 118 for cropping their format through the second multiple-format diaphragm array 42. The third multibeam deflector array 53 causes the individual changes in direction of the particle beamlets 118 in the course of the format cropping to be reset, and the fourth multibeam deflector array 54, as precision positioning array, again provides for the individual positioning of the particle beamlets 118 on the substrate 91.

In the following, the construction and operation of the multibeam deflector arrays 51 and 52 and precision positioning arrays 53 and 54 will be discussed in more detail. The latter are constructed so as to have substantially the same construction and operation at the multibeam deflector arrays 51 and 52 but are reduced by scaling.

Figure 4A:
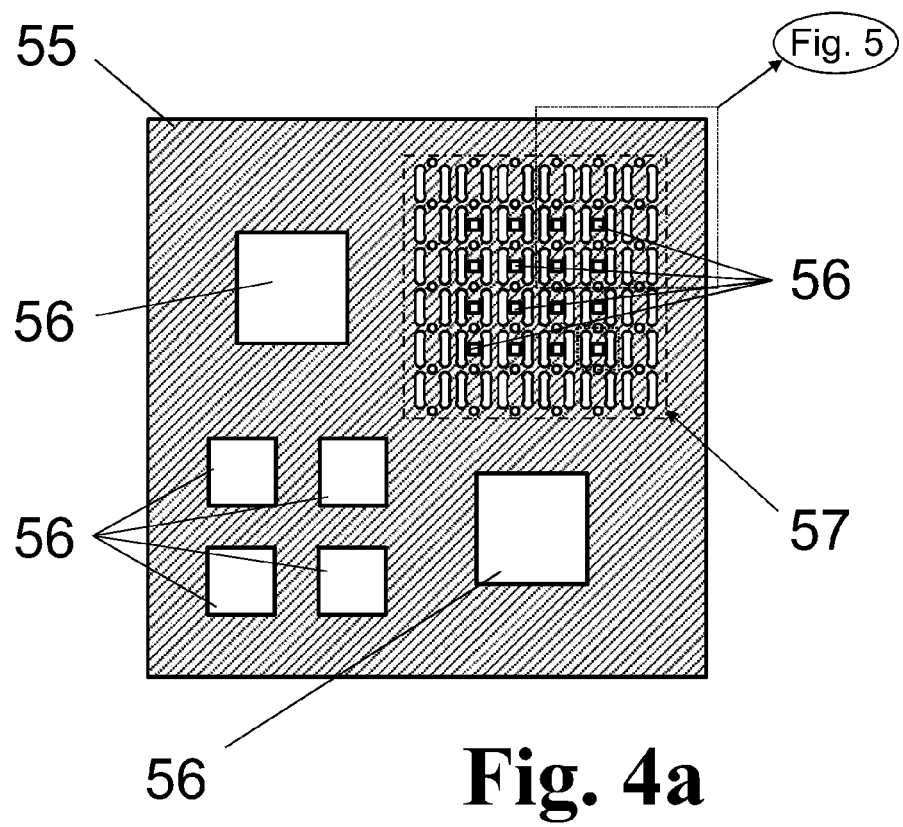
FIG. 4 shows an embodiment form of the first multiple-format diaphragm array (FIG. 4a) and of the second multiple-format diaphragm array (FIG. 4b) with the associated multibeam deflector arrays.
Figure 4B:
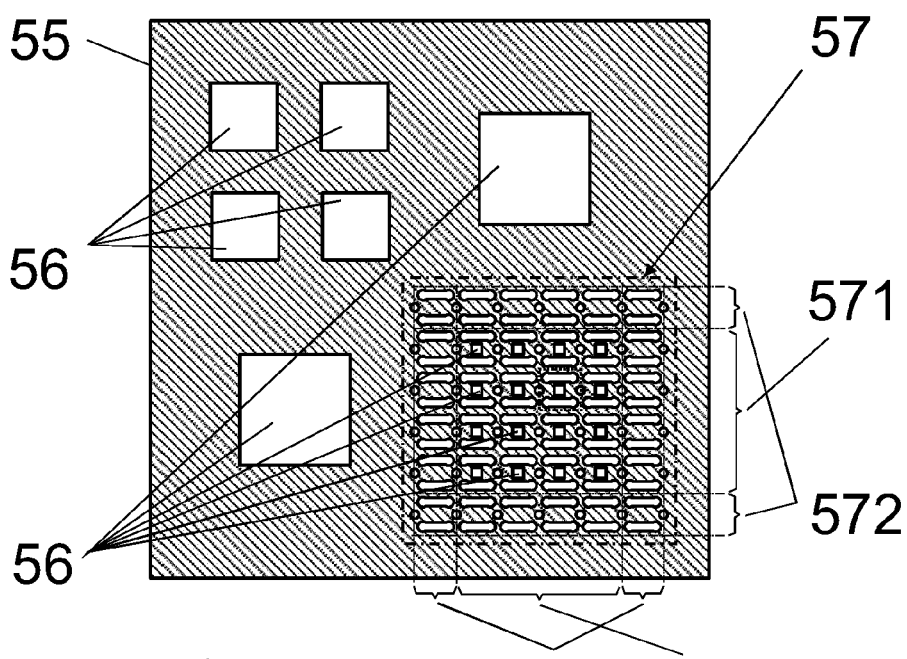
Figure 5:
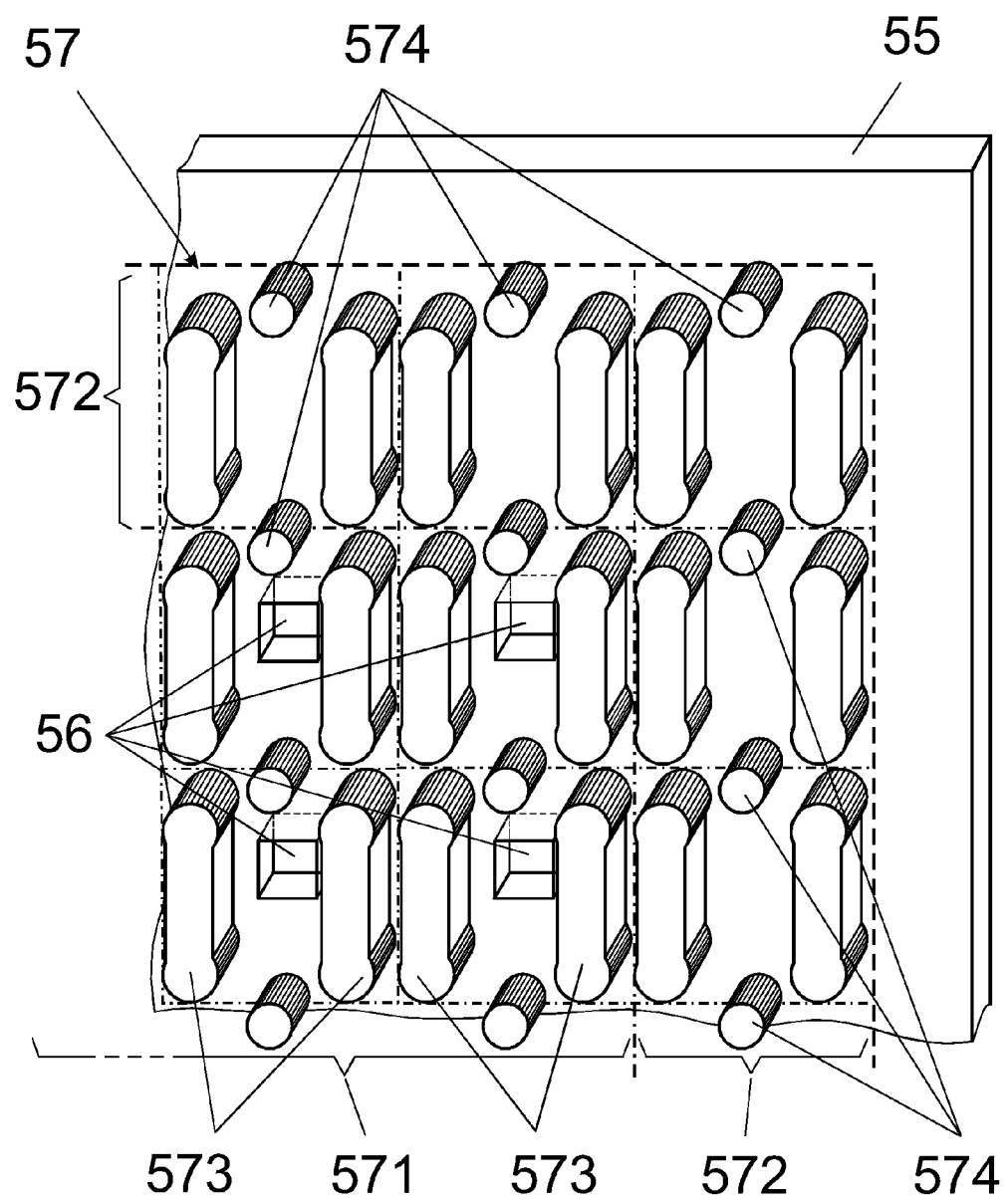
FIG. 5 shows a section from FIG. 4a showing a multibeam deflector array with an electrode structure for suppressing crosstalk.

The multibeam deflector arrays 51 to 54 each have two deflector cell arrays 57 which are closely (<1 mm) adjacent to one another in the beam direction of the particle beamlets 118 and are oriented laterally substantially orthogonal to one another and substantially comprise a uniform arrangement of electrode pairs 573 and screen electrodes 574. A 90-degree arrangement of the electrode pairs 573 is shown in FIG. 4, and an enlarged section thereof is shown in FIG. 5. The deflector chip 55 in FIG. 4a must be imagined as flipped over the deflector chip 55 shown in FIG. 4b along the center of the drawing sheet such that the surfaces of the deflector chips 55 on which the electrodes 573 and 574 are arranged face one another.

Figure 3A:
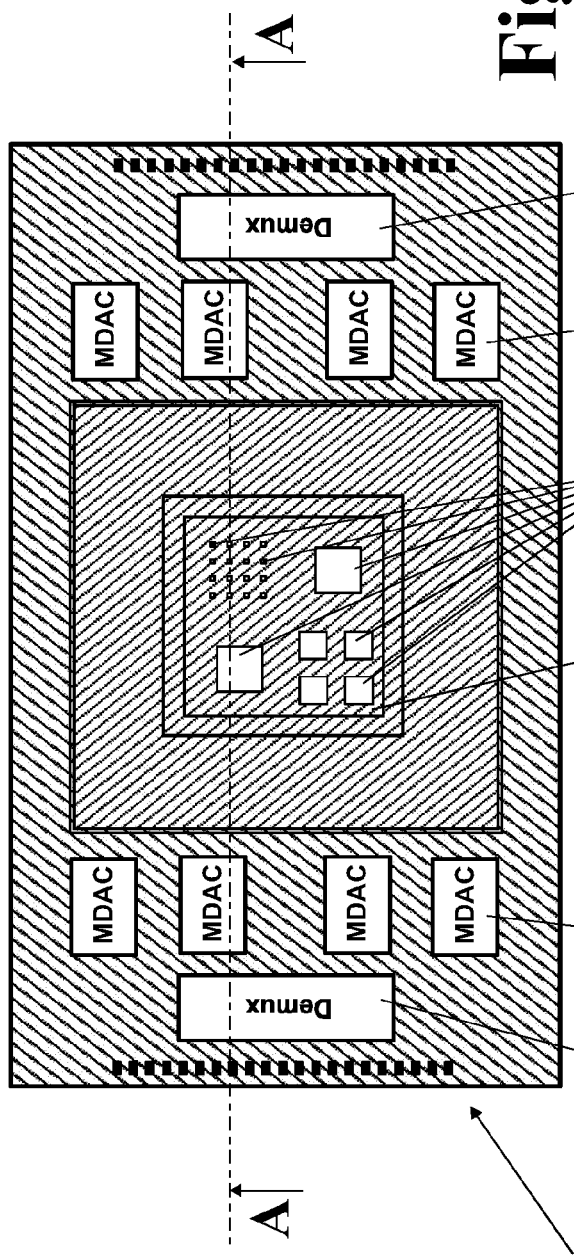
FIG. 3 shows a constructional variant of combined multiple-format diaphragm arrays and multibeam deflector arrays with control electronics on a printed circuit board (FIG. 3a) and a sectional view of a twofold arrangement for separate deflecting directions in x and y (FIG. 3b)
Figure 3B:
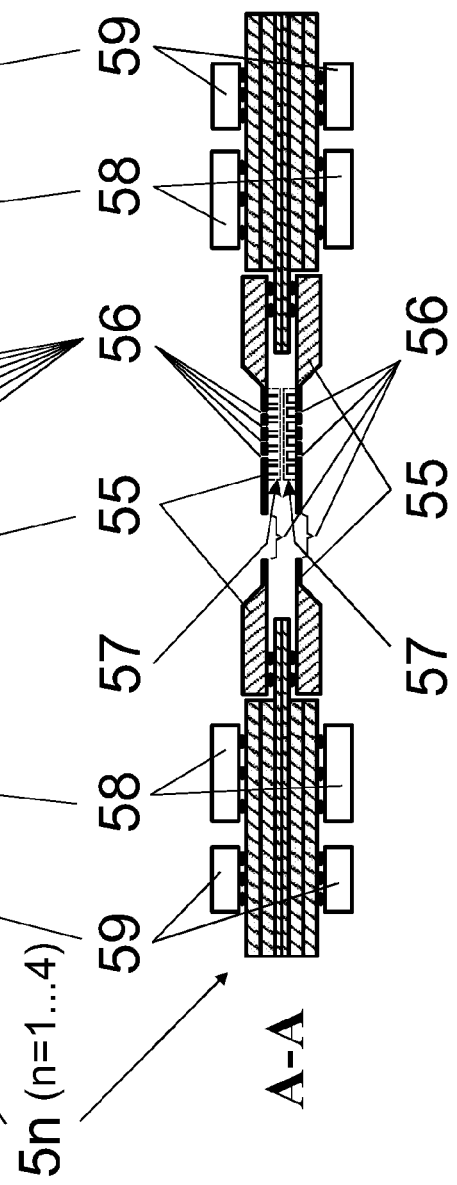

The control of the multibeam deflector arrays 51, 52, 53, whose hardware embodiment is shown in FIG. 3a, is carried out by electronic computing units in a pipeline structure as is shown in FIG. 6. The coupling matrix, which has already been mentioned, ensures that all of the particle beamlets 118 in the beamlet array can have an individual cross-sectional size ($S_{xi}$, $S_{yi}$), an individual precision positioning ($SM_{xi}$, $SM_{yi}$), and an individual position in the crossover 112. There are basically two position adjustments of interest for the individual position of the particle beamlets 118 in the crossover 112:
  a) exactly on the optical axis 115—for exposure—or
  b) as far away as possible from the optical axis 115—for blanking the particle beamlet 118 at the outlet aperture diaphragm 7.

In order to determine the deflection values for the individual deflector cells 571 of a plurality of multibeam deflector arrays 51, 52, 53 (and possibly 54) from the values for the individual format size ($S_{xi}$, $S_{yi}$) and the individual precision position ($SM_{xi}$, $SM_{yi}$) of every particle beamlet 118 by means of an individual coupling matrix and to then carry out a compensation of the crosstalk caused by deflector cells 571 adjacent in the plane, one or more digital computing units are required for implementing linear transformations consisting of multiplications and additions. Dummy deflector cells 572 which are provided in the design of the deflector cell arrays 57 do away with the necessity of special handling of the particle beamlets 118 lying at the edge and in the corners of the particle beamlet array so that all deflection values can be calculated according to the same algorithm, although this algorithm relies on individual transformation coefficients or coupling coefficients. A high degree of parallelizability in the calculation and control electronics is ensured by the property of the design of the deflector cell arrays 57 whereby an outer row of passive deflector cells (dummy deflector cells 572) is arranged around the active deflector cells 571 which each deflect a particle beamlet 118.

Since the coupling coefficients depend on the actual alignment state of the deflector cell array 57 of the particle beamlets 118, the transformations cannot be processed as part of an offline data processing, but rather must be carried out in real time during the exposure.

For reasons of productivity, computing architectures which work in a purely sequential manner (deflection value after deflection value, beamlet after beamlet) cannot be used. Computing blocks which operate in parallel and which, e.g., are associated in each instance with a particle beamlet 118 or a row or column of particle beamlets 118 in a multibeam deflector system comprising three or four multibeam deflector arrays 51 to 54 are required in order to achieve sufficient throughput rates. Further, by reducing the algorithm to suboperations of addition and multiplication which are carried out in blocks working in parallel, it is possible to combine the calculation functions with those of data transfer so that pipeline structures or systolic processor arrays can be used. Arrays of this kind can be realized in modern programmable logic circuits (FPGAs) having very high scale integration which also provide the necessary bandwidth for input and output.

After digital calculation of the individual deflection values for each deflector chip 55, a digital-to-analog conversion must be carried out to provide the deflection potentials for the individual deflector cells 571. Since every deflector cell 571 comprises pairs of electrodes 573 and, therefore, requires two control voltages symmetric to a ground potential (screen electrode 574), a total of 12n voltage potentials must be generated for controlling n particle beamlets 118 in six deflector planes (i.e., in three double deflector arrays with deflection directions X and Y) of the first and second multibeam deflector arrays 51 and 52 and the third multibeam deflector array 53 operating as precision positioning array. In implementing this circuit component, it is useful to use multichannel active components such as multi-DA converters 58 with corresponding multi-operational amplifiers.

As the quantity n of particle beamlets 118 to be controlled increases, the construction and connection technology for supplying the 12n voltages of DAC boards located outside the electron-optical column in the vacuum region of the particle beam column becomes increasingly difficult. Therefore, after n>64, instead of transferring the individual analog voltages separately, a preferred solution is to transfer the digital control values by multiplexing via a few serial high-speed connections with data rates of greater than 1 gigabyte/second into the vacuum region of the particle beam column. In this respect, the transfer can be realized by means of differential electric signals or optically by means of glass fibers or free space optics. The demultiplexing of the control data and D-A conversion thereof can then be carried out directly on each deflector chip 55 of the multibeam deflector system 5.

A control of the kind mentioned above is shown schematically in FIG. 3. Two integrated demultiplexer chips 59 supply four integrated multi-DA converters 85 on the right-hand and left-hand side, respectively, to control the deflector chip 55 which is positioned almost in the center. Two independent deflector boards which are outfitted with identical electronics modules and each of which holds a deflector chip 55 and is supplied with separate control signals are used for two deflector cell arrays 57 arranged one on top of the other in order to realize individually the X-deflection and Y-deflection of the separate particle beamlets 118 with pairs of electrodes 574 oriented orthogonally relative to one another in the two planes of the deflector cell arrays 57 situated one above the other.

This circuit arrangement solves the problem of the signal feed and also satisfies the requirement for short setting times for the deflector cell arrays 57 through a compact construction and very short, low-capacitance control lines.

As is shown in FIGS. 4a and 4b and in FIG. 5 in specific constructions of the deflector chips 55, deflector chip cutouts 56 are incorporated in the deflector cell array 57, and these deflector chip cutouts 56 are associated with the beam-shaping diaphragm group 45 for small-format particle beamlets 118 (5-20 μm) of the multiple-format diaphragm array 41 and have identically shaped or larger deflector plate cutouts 56 so that the individual particle beamlets 118 provided by the multiple-format diaphragm array 41 are not cropped but rather are deliberately influenced individually with respect to their beam direction.

To this end, an individual deflector cell 571 comprising an electrode pair 573 and two screen electrodes 574 is associated with each individual diaphragm aperture 44 of the beam-shaping diaphragm group 45 of a multiple-format diaphragm array 41 or 42 as is shown schematically in FIG. 5 and in an enlarged section from FIG. 4a.

In this connection, each of the screen electrodes 574 which are located between the parallel-oriented electrode pairs 573 of two deflector cells 571 can simultaneously shield the two neighboring deflector cells 571. In spite of the screen electrodes 574, the fields of the individual deflector cells 571 on the multibeam deflector arrays 51, 52 and the precision positioning array 53 act not only on the particle beamlet 118 passing through its associated individual deflector cell 571 but also on the adjacent particle beamlets 118 (crosstalk). This crosstalk is corrected in the following manner:

When an 8×8 beam-shaping diaphragm group 45 is used in an advantageous manner, it has proven favorable, for example, to outfit the deflector chips 55 with 10×10 deflector cells 571, 572. In order to present the construction of optimized deflector cell arrays 57 in a simpler and clearer manner, the multibeam deflector arrays 51 and 52 shown in FIGS. 4a and 4b are arranged with a 6×6 deflector cell array 57 with 4×4 active deflector cells 571 within an outer frame of one dummy deflector cell 572, no deflector plate cutout 56 being provided between the electrode pair 573 of the latter. Accordingly, the 4×4 array of deflector cells 571 is supplemented in such a way that a dummy deflector cell 572 is located on all sides around the field of the sixteen deflector plate cutouts 56.

The following estimates for the crosstalk behavior of the deflector cell array 57 are given for a real 10×10 deflector cell array 57 using this scheme in the same way with an 8×8 array of active deflector cells 571.

Disregarding the crosstalk for the time being, the voltages at the 10×10 deflector cells 571 are:

$$U_{ij}^0 i,j=0 \ldots 9.$$

The outer rows of the deflector cell array 57 are dummy deflectors 572 to which no voltage is applied, i.e.:

$$U_{0j}^0=U_{9j}^0=U_{i0}^0=U_{i9}^0=0 i,j=0 \ldots 9.$$

The actual deflector voltages for the active deflector cells 571 are:

$$U_{ij}^0 i,j=1 \ldots 8.$$

By inserting dummy deflectors 572, every active deflector cell 571 "sees" the same surroundings. Therefore, the "active deflector cell array" 57 comprises only the inner 8×8 active deflector cells 571 whose voltages must be corrected owing to crosstalk. Let the corrected voltages be:

$$U_{ij} i,j=0 \ldots 9.$$

Since the outer frames around the active deflector cells 571 are dummy deflectors 572, then:

$$U_{0j}=U_{9j}=U_{i0}=U_{i9}=0 i,j=0 \ldots 9.$$

The deflecting action of an individual deflector cell 571 is changed by the crosstalk due to the interfering effect of the other deflector cells 571 of the deflector cell array 57. Since the crosstalk effect is small, it can be considered as sufficient to allow for the interfering effect of the eight immediate neighbors of a deflector cell 571 in question. The simplest possibility for correcting crosstalk consists in applying a correcting voltage to the deflector cells 571 in question which compensate for the crosstalk effect of the voltages of the eight directly adjoining deflector cells 571.

In this regard, the following exceptions are made:
1. The crosstalk effect on deflector cells 571 situated farther away (outside of the eight immediate neighbors) is disregarded.
2. The fact that the correcting voltages applied to the deflector cell 571 in question are themselves subject to crosstalk (second-order effect) is disregarded.
3. An inside deflector cell 571 is influenced exclusively by the crosstalk from its eight directly adjacent deflector cells 571.

Every deflector cell 571 within a field of nine adjacent deflector cells 571 and 572 can be considered sufficiently defined by the exceptions mentioned above.

The eight neighboring cells of a selected, inside deflector cell 571 are designated by the symbols LO, LM, LU, MO, MU, RO, RM, RU which identify the positions of the eight neighbors according to the following scheme:

| LO | MO | RO |
|----|----|----|
| LM | 1  | RM |
| LU | MU | RU |

Assuming that only the inner deflector cell 571 of the nine deflector cells 571 in question are controlled and causes the deflection "1" for "its" particle beamlet 118, this gives a deflection of the following magnitude due to the crosstalk on the eight adjacent particle beamlets 118:

$$C_{LO}, C_{LM}, C_{LU}, C_{MO}, C_{MU}, C_{RO}, C_{RM}, C_{RU}.$$

The quantities $C_{LO}$, $C_{LM}$, etc. are the crosstalk coefficients. In case of a deflector cell array 57 comprising uniform, structurally identical deflector cells 571, 572, these quantities are typically less than 5%. In theory, they can be determined by suitable modeling or even empirically.

It is further assumed that these coefficients are identical for all of the inner deflector cells 571.

Let an inner deflector cell 571 in the 10×10 deflector cell array 57 considered above have the uncorrected control voltage $U_{ij}^0$. The corrected control voltage would then be:

$$U_{ij}=U_{ij}^0-C_{RU}*U_{i-1,j-1}^0-C_{MU}*U_{i-1,j}^0-C_{LU}*U_{i-1,j+1}^0-C_{RM}*U_{i,j-1}^0-C_{LM}*U_{i,j+1}^0-C_{RO}*U_{i+1,j-1}^0-C_{MO}*U_{i+1,j}^0-C_{LO}*U_{i+1,j+1}^0 i,j=1 \ldots 8$$

In this respect, it is not taken into account (according to the first exception mentioned above) that the correction of the control voltage of an adjacent deflector cell 571 also acts on the next deflector cell but one 571 or 572 due to the crosstalk (higher-order effects are disregarded). This appears allowable because the coefficients $C_{LO}$, $C_{LM}$, etc. are quantitatively less than 0.05.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for the illuminating a substrate with individually shaped controllable particle beams comprising:
   a particle beam source emitting a particle beam;
   a first multiple-format multiple-diaphragm aperture array capable of generating beamlets with different cross sections generating separate particle beamlets;
   an illumination system shaping and deflecting a particle beam illuminating the first diaphragm array;
   a condenser lens system;
   a second multiple-format multiple-diaphragm aperture array capable of generating beamlets with different cross sections having diaphragm apertures adapted to the first diaphragm array using an imaging scale, the first diaphragm array being imaged by the condenser lens system on the second diaphragm array;
   an outlet aperture diaphragm at a first beam crossover, wherein the second diaphragm array is between the outlet aperture diaphragm and the first diaphragm array;
   a reduction optics comprising at least one stage for reduced imaging of the beamlets passed by the second diaphragm array onto the substrate; and
   a multi-beam deflector system for individual deflection of the beamlets comprising at least three multi-beam deflector arrays:
   a first multi-beam deflector array between the first diaphragm array and the second diaphragm array generating by individual deflection of the beamlets different cross sections of the beamlets after the beamlets pass the second diaphragm array,
   a second multi-beam deflector array adjacent to the second diaphragm array deflecting beamlets in partial crossovers and capable of blanking individual beamlets by directing them at the outlet aperture diaphragm or the second diaphragm array, and a third multi-beam deflector array at a distance from the second diaphragm array of between 10% and 20% of the distance between the second diaphragm array and a second beam crossover directing the beamlets to different positions on the substrate.

2. The system of claim 1,
wherein the multi-beam deflector arrays comprise two deflector chips arranged one on top of the other;
wherein each of the deflector chips comprises a deflector cell array comprising identical pairs of electrodes for individual deflection of the beamlets in a direction lateral to an optical axis of the system;
wherein the pairs of electrodes of the deflector cell arrays on the two deflector chips are oriented in substantially orthogonal directions relative to one another.

3. The system of claim 2, wherein the pairs of electrodes of the deflector cell arrays on the two deflector chips are oriented in orthogonal directions relative to one another.

4. The system of claim 3, further comprising a beam-shaping diaphragm group formed as an n×m array,
wherein the deflector cell arrays comprise at least (n+2) rows and (m+2) columns of deflector cells of parallel pairs of electrodes on every deflector chip, and
wherein no voltage is applied to peripheral deflector cells of the deflector cell arrays.

5. The system of claim 4, further comprising
means for calculating voltage and regulating voltage,
wherein for each beamlet a crosstalk effect of eight directly adjacent deflector cells is used for calculating correction of deflection voltages in a deflector cell array to compensate for crosstalk between adjacent deflector cells of the deflector cell array.

6. The system of claim 4, wherein the multi-beam deflector arrays comprise fast pipeline structures comprising multi-channel active components for independent control of the beamlet position, cross-sectional area, and individual crossover position for each beamlet.

7. The system of claim 6, wherein the fast pipeline structures comprise multi-DA converters, demultiplexers, and multi-operational amplifiers.

8. The system of claim 6, further comprising a coupling matrix controlling the multi-beam deflector arrays for independent control over a position and size of beamlets on the substrate and over a crossover position for each beamlet in x-direction and y-direction.

9. The system of claim 1, further comprising an illumination group selector and a stigmator for the particle beam selecting an illumination group on the first diaphragm array.

10. The system of claim 9, further comprising a pre-programmable control unit controlling the illumination group selector with the stigmator for optimized selection of illumination groups on the first diaphragm array to minimize a number of exposure steps.

11. The system of claim 1, wherein the diaphragm arrays comprise
at least two large diaphragm apertures with an edge length between 30 µm and 200 µm for exposure with a large-format particle beam and
at least one beam-shaping diaphragm group comprising diaphragm apertures with an edge length between 5 µm and 20 µm.

12. The system of claim 11, further comprising an illumination group selector,
wherein the diaphragm arrays have different beam-shaping diaphragm groups,
wherein the illumination group selector is capable of illuminating separately one of the beam-shaping diaphragm groups of the first diaphragm array to generate differently dimensioned particle beams and arrays of particle beamlets.

13. The system of claim 11, wherein the second diaphragm array further comprises means for exposing repetitive structures.

14. The system of claim 11, wherein the diaphragm arrays further comprise different beam-shaping diaphragm groups having identical diaphragm apertures.

15. The system of claim 11, wherein the diaphragm arrays further comprise different beam-shaping diaphragm groups having different diaphragm apertures.

16. The system of claim 1, wherein the second multi-beam deflector array is between the first diaphragm array and the second diaphragm array.

17. The system of claim 16,
wherein the first multi-beam deflector array is adjacent to the first diaphragm array and
wherein the second multi-beam deflector array is adjacent to the second diaphragm array.

18. The system of claim 17, further comprising a fourth multi-beam deflector array,
wherein the third multi-beam deflector array functions as a first precision-positioning array, is adjacent to the second diaphragm array, and is between the second diaphragm array and the fourth multi-beam deflector array, and
wherein the fourth multi-beam deflector array functions as a second precision positioning array.

19. The system of claim 1, wherein the second diaphragm array is between the first diaphragm array and the second multi-beam deflector array.

20. The system of claim 19,
wherein the first multi-beam deflector array is adjacent to the second diaphragm array and
wherein the second multi-beam deflector array is adjacent to the second diaphragm array.

21. The system of claim 19,
wherein the first multi-beam deflector array is adjacent to the first diaphragm array and
wherein the second multi-beam deflector array is adjacent to the second diaphragm array.

22. The system of claim 1, further comprising a stigmator correcting for tolerance-dependent distortion comprising at least two stages and positioned between the third multi-beam deflector array and the reduction optics.

* * * * *